United States Patent [19]
Bito et al.

[11] Patent Number: 5,345,173
[45] Date of Patent: Sep. 6, 1994

[54] DATA PROCESSING METHOD TO REDUCE TRUNCATION ARTIFACTS IN NUCLEAR MAGNETIC RESONANCE APPARATUS

[75] Inventors: Yoshitaka Bito, Kokubunji; Kensuke Sekihara, Musashimurayama; Ryuichi Suzuki, Kokubunji, all of Japan

[73] Assignees: Hitachi, Ltd.; Hitachi Medical Corp., both of Tokyo, Japan

[21] Appl. No.: 922,473

[22] Filed: Jul. 31, 1992

[30] Foreign Application Priority Data

Aug. 2, 1991 [JP] Japan ................... 3-193890

[51] Int. Cl.$^5$ .......................................... G01R 33/20
[52] U.S. Cl. ........................ 324/309; 324/307
[58] Field of Search ........................ 324/307, 309; 364/413.19; 128/653.2

[56] References Cited

U.S. PATENT DOCUMENTS

| | | | |
|---|---|---|---|
| 4,780,675 | 10/1988 | DeMeester | 324/312 |
| 4,950,991 | 8/1990 | Zur | 324/312 |
| 4,973,111 | 11/1990 | Haacke et al. | 324/309 |
| 4,998,064 | 3/1991 | Fuderer et al. | 324/309 |
| 5,001,429 | 3/1991 | Constable et al. | 324/312 |

OTHER PUBLICATIONS

Joel Martin et al., "Modified Linear Prediction Modeling in Magnetic Resonance Imaging", vol. 82, pp. 392–399 (1989) (no month).

*Primary Examiner*—Michael J. Tokar
*Assistant Examiner*—Raymond Y. Mah
*Attorney, Agent, or Firm*—Antonelli, Terry, Stout & Kraus

[57] ABSTRACT

A data processing method for image reconstruction in an NMR apparatus for use in the medical field which reduces a computation quantity relating to data extrapolation when truncation artifacts are reduced by data extrapolation. The data processing method is utilized with an inspection apparatus including a magnetic field generation apparatus for generating each of a static magnetic field, gradient magnetic field and RF magnetic field, a signal detection device for detecting NMR signals from an inspection object, a computer for computing detection signals of the signal detection device and for outputting the result of computation by the computer, for obtaining an image by effecting inverse Fourier transform for a measurement signal row representing data of spatial frequency space. An evaluation value representing the magnitude of ringing which occurs because a measured spatial frequency domain is limited in the spatial frequency space is utilized for comparison with a threshold value and signals are extrapolated into spatial frequency domains which are located outside of a measured spatial frequency domain by use of coefficients computed from the signals of the measured spatial frequency domain only when the evaluation is greater than the threshold value so that an image in which the ringing thereof is corrected is obtained.

26 Claims, 4 Drawing Sheets

DATA PROCESSING METHOD TO REDUCE TRUNCATION ARTIFACTS IN NUCLEAR MAGNETIC RESONANCE APPARATUS

CROSS-REFERENCE TO RELATED APPLICATION

The present application relates to subject matter described in application Ser. No. 07/756896 filed Sep. 9, 1991 entitled "DATA PROCESSING METHOD IN NUCLEAR MAGNETIC RESONANCE MEASUREMENT" by Yoshitaka BITO, et al.

BACKGROUND OF THE INVENTION

This invention relates to a data processing method in a nuclear magnetic resonance (NMR) apparatus. More particularly, it relates to a processing method of data for image reconstruction in the NMR apparatus in the medical field.

Conventionally, two-dimensional fast Fourier transform (2D-FFT) has been used as a method of reconstructing two-dimensional images in the NMR apparatus. According to this method, however, ringing referred to as "truncation artifacts" occurs because a measurement region is limited. A method is known which approaches smoothly measurement data to "0" near the end of a measurement region by the use of filters in order to eliminate the truncation artifacts, but this method involves the problem that resolution drops. To solve this problem, a method which extrapolates appropriate data by linear prediction and reduces the truncation artifacts without lowering resolution has been proposed. However, a computation quantity required for linear prediction is enormous and the reduction of the computation quantity is a key to the practical application of this method.

The following two references are known as the prior art most approximate to the present invention:

"Proceedings of Japanese Magnetic Resonance in Medicine, 16th Meeting", p. 284 (1990).

"Journal of Magnetic Resonance", Vol. 82, pp. 392-399 (1989).

These methods multiply data by a weight and effect linear prediction for the product to reduce the truncation artifacts.

SUMMARY OF THE INVENTION

The prior art technique described above does not consider the reduction of the computation quantity necessary for data extrapolation when the truncation artifacts are reduced by data extrapolation, and are not free from the problem that when the methods are put into practical application, an extremely long computation time is necessary.

With the background described above, the present invention aims at providing a data processing method in the NMR apparatus which solves the problems with the prior art described above and which can reduce the computation quantity necessary for data extrapolation when the truncation artifacts are reduced by data extrapolation.

In a data processing method for use in an inspection apparatus including magnetic field generation means for generating each of static magnetic field, gradient magnetic field and radio frequency (RF) magnetic field, signal detection means for detecting a nuclear magnetic resonance (NMR) signals from an inspection object, a computer for computing detection signals from the signal detection means and output means for outputting the computation result of the computer, for obtaining an image by effecting inverse Fourier transform of a measurement signal row representing data of spatial frequency domains, the object of the invention described above can be accomplished by the steps of computing an evaluation value representing the magnitude of ringing occurring when signals of the spatial frequency domains are cut off from signals of measured spatial frequency domain, extrapolating signals into those domains, in which measurement points do not exist, by the use of coefficients calculated from the signals of the measured spatial frequency domains, only when the evaluation signal is greater than a predetermined threshold value, and obtaining an image ringing of which is corrected.

In the data processing method according to the present invention, data extrapolation is effected only for the portions in which the truncation artifacts occur vigorously, by introducing the evaluation value representing the magnitude of ringing. Accordingly, the computation quantity necessary for data extrapolation can be reduced drastically.

The truncation artifacts vigorously occur at the portions at which an image changes drastically, but hardly occur at the portions at which the image changes smoothly. Therefore, data extrapolation is effected only for the portions inclusive of the portions of which the image changes drastically, but is not effected at the portions at which no truncation artifact occurs. According to this selective data extrapolation method, the computation quantity can be reduced, and this is the principle of the present invention. Hereinafter, the present invention will be explained in further detail.

When a function f is a measurement object, a function $\hat{f}$ as Fourier transform can be obtained as measurement data in nuclear magnetic resonance. When the function f contains abruptly changing portions, a large number of radio frequency components are contained in the function $\hat{f}$. For quantitative evaluation, therefore, a function as the product of the frequency $\hat{f}$ by a frequency offset is determined and the size of this function is evaluated. The resulting numeric value is employed as an evaluation value representing the magnitude of ringing, and whether or not data extrapolation is to be made is decided in accordance with this evaluation value.

Hereinafter, a method which applies this method to two-dimensional image obtained in a practical NMR apparatus will be explained in detail.

Measurement data obtained by a spin echo method are arranged in matrix in a spatial frequency domain as depicted in FIG. 3 of the accompanying drawings. Here, a Kx direction represents a readout direction in which the time change of signals is read out, and a Ky direction represents an encode direction in which a phase change is provided to the signals.

To begin with, the case where data extrapolation is effected in the readout direction will be explained.

First, inverse Fourier transform is effected in the encode direction. As to each line in the readout direction, one-dimensional data extrapolation can thus be applied. This function is regarded as the function $\hat{f}$ on the one-dimensional space for each line in the readout direction, and the function $\hat{g}$ as the product of the function $\hat{f}$ by an offset distance from an origin of the signal is computed. Then, the magnitude of the function $\hat{g}$ is computed, and is used as an evaluation value that represents the magnitude of ringing. Data extrapolation is effected for the function $\hat{f}$ when this evaluation value is greater than a certain threshold value, and is not effected when the evaluation value is not greater than the threshold value. Finally, inverse Fourier transform is effected in the readout direction, and the image is displayed.

To make data extrapolation in the encode direction, a method which exchanges the role in the read out direction with the role in the encode direction is employed. These two methods are used in combination when data extrapolation is made in both of the readout and encode directions.

As explained above in detail, the present invention can accomplish a data processing method in the NMR apparatus which can reduce the computation quantity necessary for data extrapolation when the trancation artifacts are reduced by the use of data extrapolation.

DESCRIPTION OF THE PREFERRED EMBODIMENTS

Hereinafter, preferred embodiments of the present invention will be described in detail with reference to the accompanying drawings.

Figure 4:
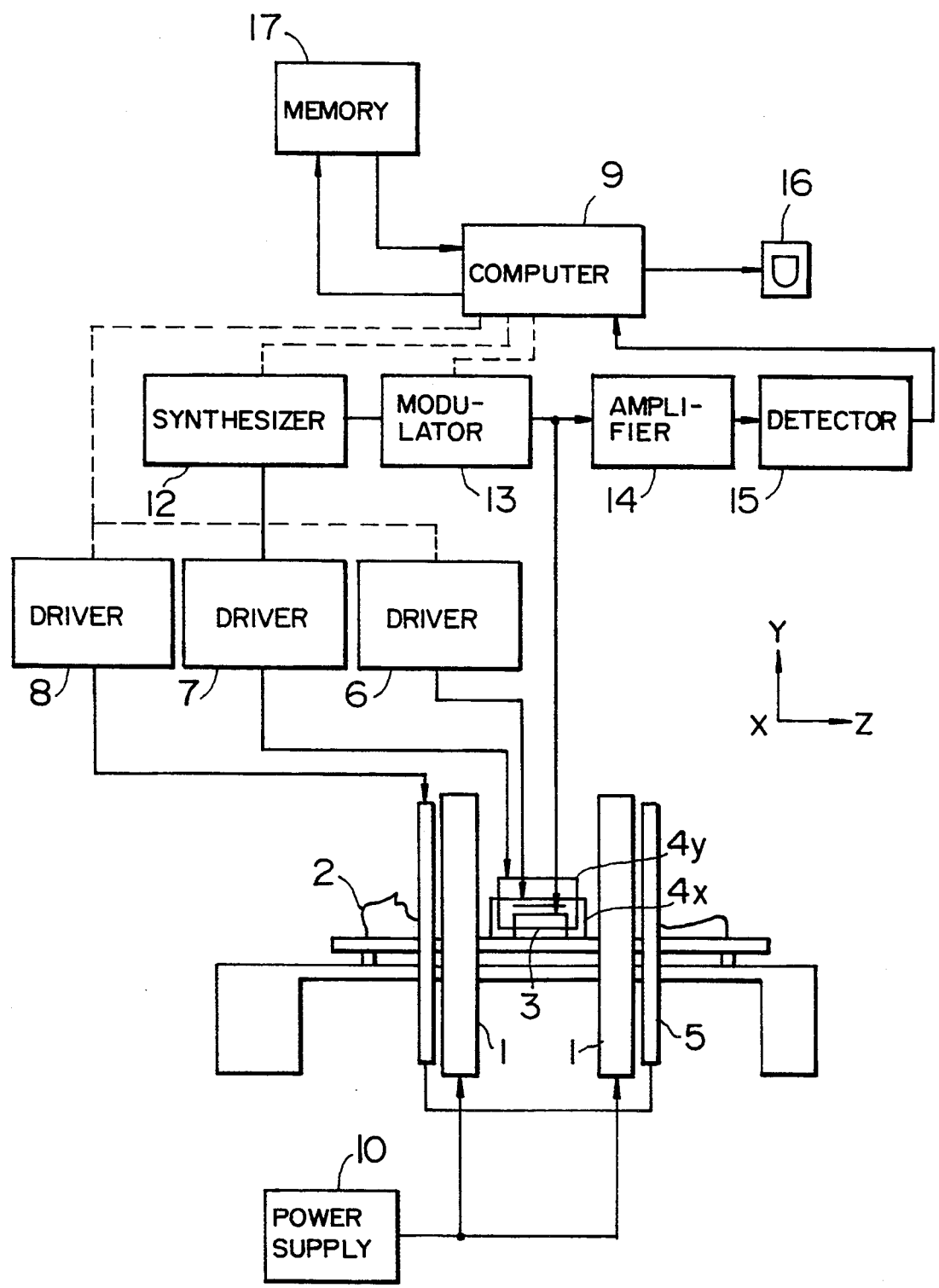
FIG. 4 is a block diagram showing an example of the construction of an apparatus for practicing the data processing method according to the present invention.

FIG. 4 is a schematic structural view showing an inspection apparatus using a nuclear magnetic resonance (NMR) apparatus (hereinafter merely referred to as the "inspection apparatus") as the object of application of the data processing method in a NMR apparatus according to the present invention.

In the drawing, reference numeral 1 denotes an electromagnet for generating a static magnetic field $H_o$, and reference numeral 3 denotes a coil for generating a radio frequency (RF) magnetic field and simultaneously, for detecting signals generated from an object 2. Reference numerals 4x, 4y and 5 represent gradient field generation coils for generating gradient magnetic fields in X, Y and Z directions, respectively. A coil which is wired in such a fashion that currents flow in mutually opposite directions is used as the gradient field generation coil 5. Reference numerals 6, 7 and 8 denote drivers for supplying the currents to the gradient field generation coils 4x, 4y and 5, respectively. Reference numeral 9 denotes a computer and 10 does a power supply unit for the static field generation magnet 1.

Next, the outline of the operation of this inspection apparatus will be explained.

The RF magnetic field for exciting the nuclear spin of the object 2 is generated by shaping the waveform of the radio frequency generated by a synthesizer 12, power-amplifying the waveform-shaped wave by a modulator 13, and supplying a current to the coil or the RF transmitter and receiver 3. The signal from the object 2 is received by the RF transmitter and receiver 3, is passed through an amplifier 14, is subjected to quadrature detection by a phase detector 15 and is then inputted to the computer 9. The computer 9 processes the signal and then displays an image corresponding to the density distribution or relaxation time distribution of the nuclear spin on a CRT display 16. Reference numeral 17 denotes a memory for storing data during the arithmetic operation, or the final data. A sequence such as the one shown in FIG. 5, for example, is employed in order to practice the data processing method according to the present invention in such an inspection apparatus.

Figure 5:
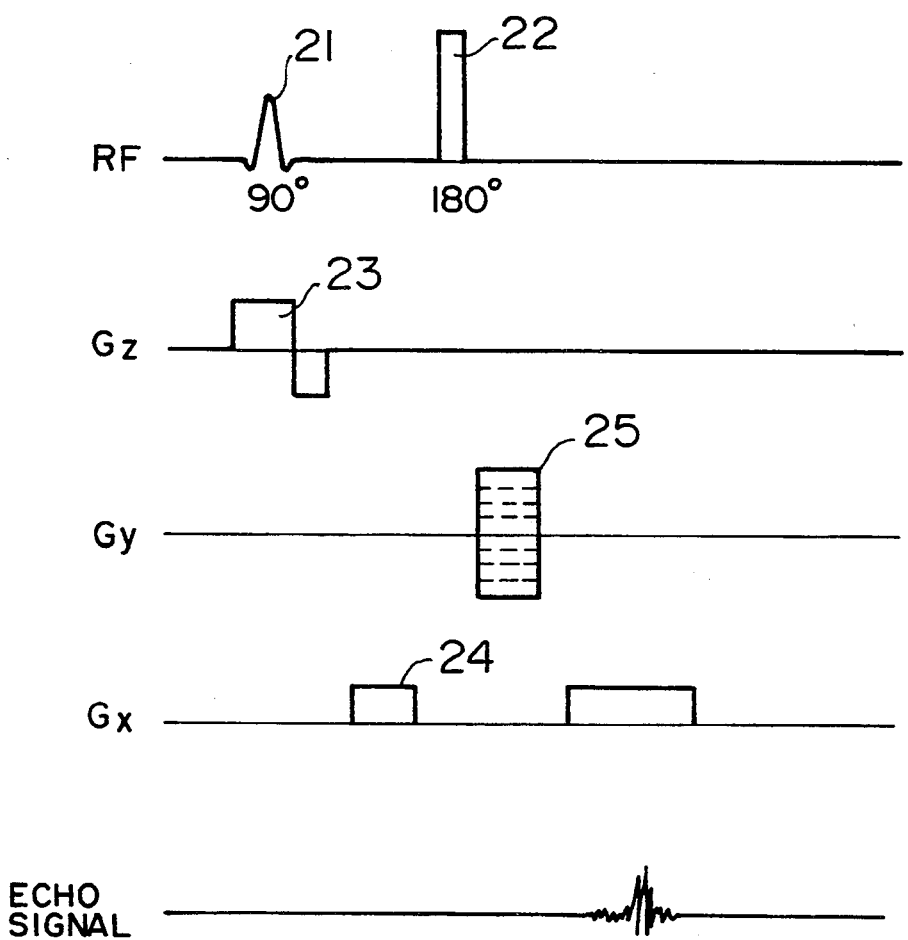
FIG. 5 is a diagram showing an example of a pulse sequence used when a spin echo method is carried out.

FIG. 5 shows a typical example of a measuring sequence for the afore-mentioned 2D-FFT method. To begin with, a 90° radio frequency magnetic field (RF) pulse 21 is irradiated with the irradiation of the gradient magnetic field pulse 23 in the Z direction to excite the magnetic field inside a slice at a certain plane perpendicular to the Z axis. Next, the magnetization is inversed by a 180° RF pulse 22 to form an echo. However, the echo signal is sampled and measured under the state where the gradient magnetic field Gx in the X direction (referred to as a "readout gradient magnetic field") is irradiated. A gradient magnetic field Gx 24 for dephasing once the spin phase in the X direction is irradiated for a predetermined time between the 90° RF pulse and the 180° RF pulse in order to prevent the occurrence of deviation of the peak of the echo due to the irradiation of this readout gradient magnetic field.

Before the measurement of the echo signal, a phase encoding gradient magnetic field Gy 25 is irradiated so as to encode the position data of the spin phase in the y direction. This measurement is carried out by iterating My times the value of the gradient and time product of the phase encoding gradient magnetic field while changing it My times in accordance with a program. A dash line Gy in FIG. 5 represents the amplitude of Gy for each iteration. If the sampling number during the measurement time is Mx, measurement data row of Mx×My can be obtained by the iteration of the measurement described above.

Figure 3:
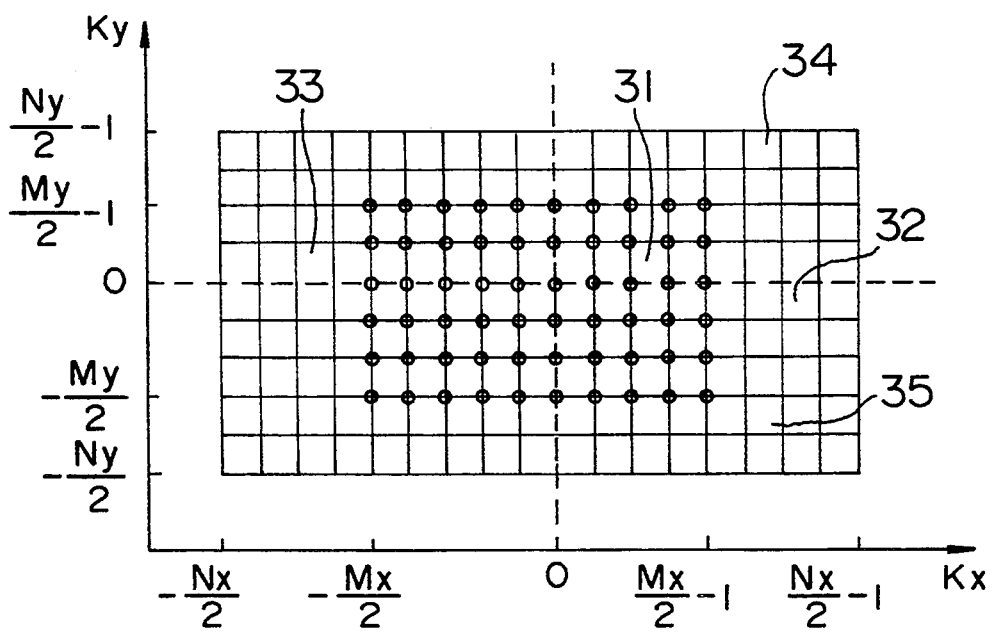
FIG. 3 is a diagram showing a trajectory of measuring data points in a K-space (spatial frequency space) used when the present invention is practiced, and a trajectory of data points to be extrapolated.

The data arrays obtained by such a sequence are arranged in matrix as represented by a region 31 in FIG. 3. The data array will be expressed as F(Kx, Ky). Here, the Kx direction is a readout direction in which the time change of the signal is read, and the Ky direction is an encode direction in which a phase change is applied to the signal, as already described. The symbols Kx and Ky represent discrete spatial frequencies, and they assume the values $Kx = -Mx/2, \ldots, Mx/2-1$, $Ky = -My/2, \ldots, My/2-1$, respectively. Further, Mx and My represent the data numbers in the readout direction and in the encode direction, respectively. In other words, the measured data rows are aligned in the matrix on the (Kx, Ky) domain.

The data processing method according to the present invention is applied to the data array having the data structure described above in the following way in accordance with the flowchart showing an embodiment of the data processing method of the present invention.

The primary points of the data processing method are as follows. When a function f is the object of measurement, a function $\hat{f}$ as Fourier transform of the function f can be obtained as measurement data in NMR (step 30 in FIG. 1). When a position or positions changing drastically exist in the function f, the function $\hat{f}$ contains a large number of radio frequency components. For quantitative evaluation, a function is obtained by multiplying the frequency f̂ by frequency offset (step 31 in FIG. 1), as shown in FIG. 2. The quantity of this function is then calculated (step 32 in FIG. 1). This numeric value is employed as an evaluation value representing the magnitude of ringing, and whether or not data extrapolation is to be made is decided by this evaluation value (step 33 in FIG. 1). In other words, the function ĝ as the product obtained by multiplying the offset distance from the origin of the signal is calculated, its magnitude is determined and is used as the evaluation value representing the magnitude of ringing. When this evaluation value is greater than a certain threshold value, data extrapolation is made for the function f̂ to reduce trancation artifacts (step 34 in FIG. 1), and if it is not, data extrapolation is not made. After the processing described above, inverse Fourier transform of the function f̂ as the measurement data is effected and the function f of the object is determined (step 35 in FIG. 1). Hereinafter, the data processing method according to the present invention will be explained in further detail.

First of all, the function on a one-dimensional space will be explained.

It will be hereby assumed that the function on one-dimensional bounded interval in the frequency domain is f̂ (step 30 in FIG. 1) and the origin of this function is c. The origin c is set in such a fashion that the absolute value |f̂| of the function becomes maximal, for example. However, there is the case where the origin is known in advance, and this calculation is not necessary in such a case.

The offset distance from the origin is defined by a function r(K) which is in turn defined by the following equation (1a) or (1b):

$$r(K)=K-c \quad (1a)$$

or $$r(K)=\exp(2\pi i(K-c)/N) \quad (1b)$$

where
K: spatial frequency,
c: origin of signal,
i: imaginary number unit,
N: number of data.

Figure 1:
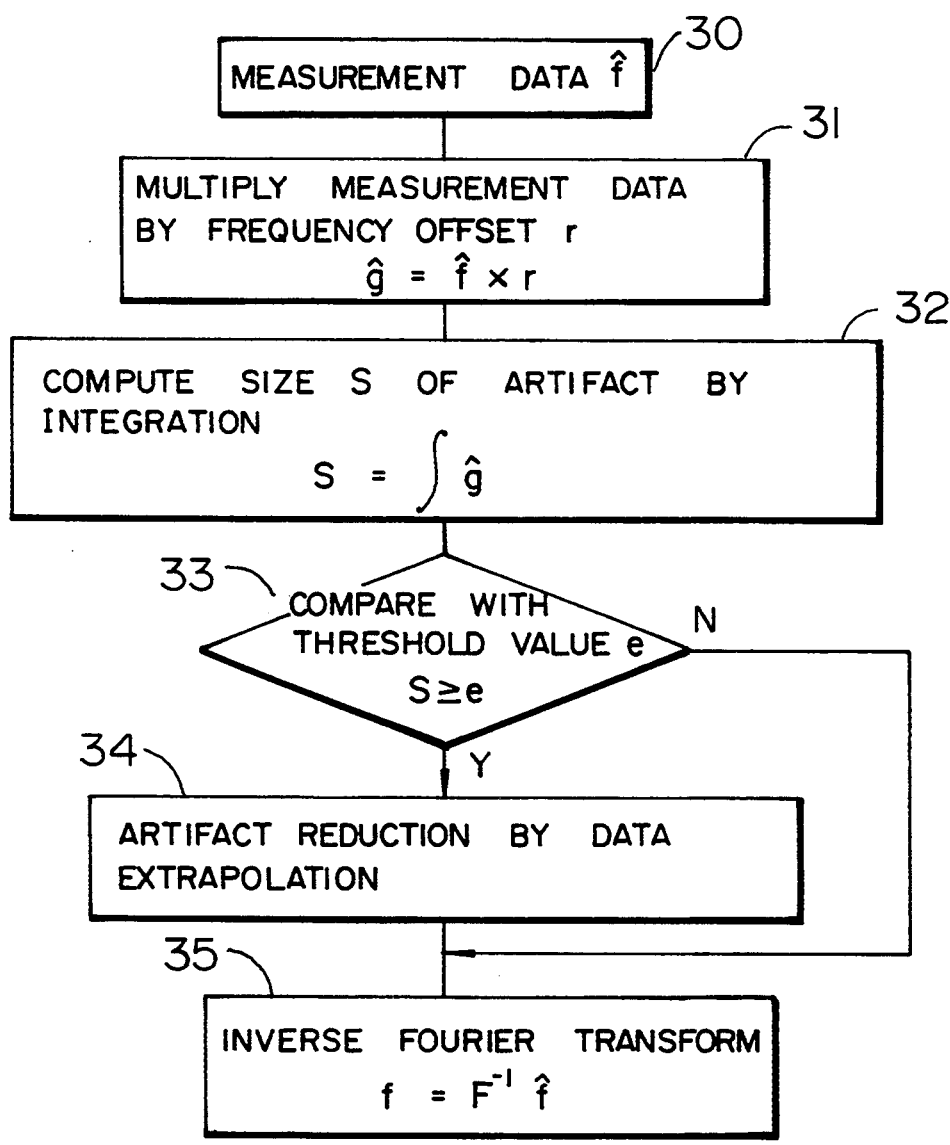
FIG. 1 is a flowchart of a data processing method according to an embodiment of the present invention.
Figure 2:
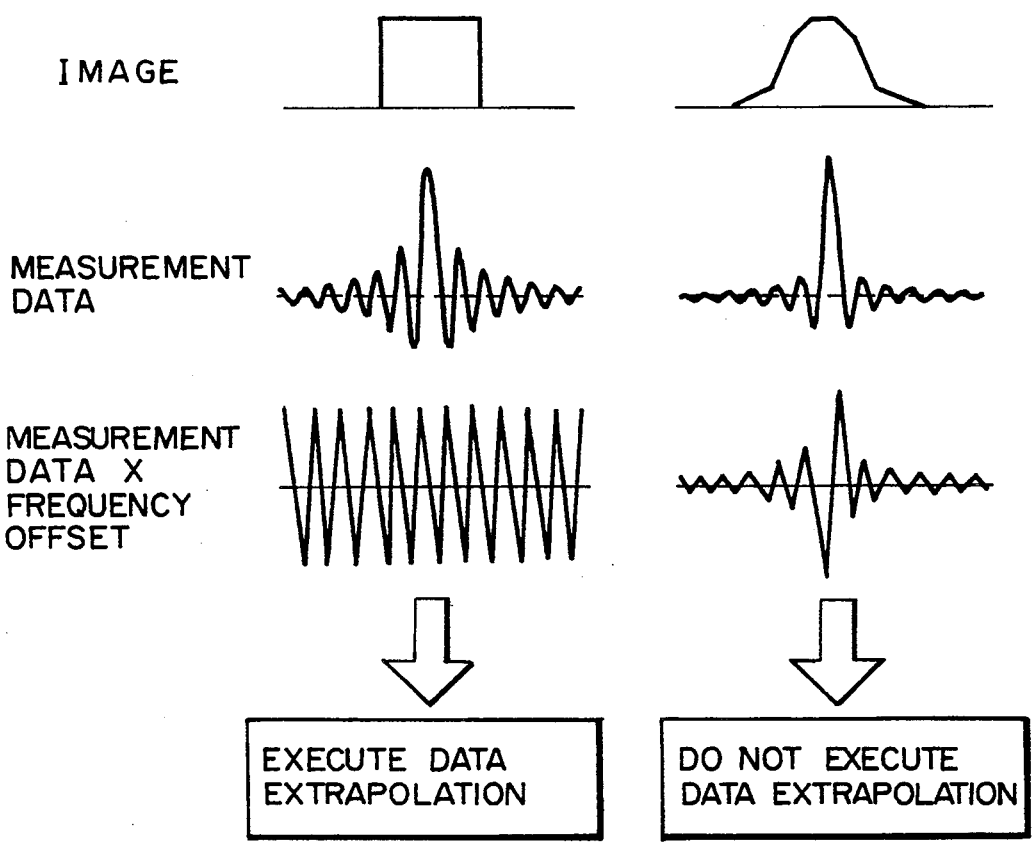
FIG. 2 is a diagram showing the principle of the present invention.

The function ĝ is calculated by multiplying the function f̂ by the offset distance r defined above (step 31 in FIG. 1). The square of the absolute function, i.e. $|\hat{g}|^2$, is calculated and the value obtained by integrating the function from the origin in the positive direction is called "Su", and in the negative direction, "Sd". These two values Su and Sd are determined as the evaluation values representing the magnitude of ringing of the function f. To determine the evaluation values representing the magnitude of the function f, there are the method which uses as such the absolute value |ĝ| in place of the square, and the method which integrates the whole domains instead of integration in the positive and negative directions, and uses the integration value as the evaluation value S representing the magnitude of ringing of the function f (step 32 in FIG. 1). Since the function f̂ is generally defined in the discrete domain, the integration value is obtained as a discrete sum but not as a continuous function in such a case.

The evaluation values Su, Sd thus obtained and representing the magnitude of ringing of the function f are compared with a certain threshold value e, and if Su>e (or Su≧e), data extrapolation is effected for the function f in the positive direction. If |Sd|>e (or |Sd|≧e), data extrapolation is effected for the function f̂ in the negative direction. When the value representing the magnitude of ringing of the function f̂ is given by one evaluation value, i.e. S, data extrapolation is effected for the function f̂ in both directions when S>e (or S≧e) (refer to step 33 in FIG. 1).

As to the determination method of the threshold value e, lines for carrying out linear prediction increase if the threshold value e is small, and the computation quantity increases. If the threshold value e is made great, on the contrary, the lines for carrying out linear prediction decreases and the computation quantity decreases. The most suitable threshold value greatly depends on the object, a signal-to-noise ratio (S/N) and the apparatus, and must be so changed as to correspond to the apparatus used and to the portion to be imaged. The determination method includes, for example, a method which calculates the maximum value (mean value, center value or median) of the evaluation value representing the magnitude of ringing and sets some percents to the threshold value, and a method which aligns the evaluation values representing the magnitude according to the size and uses some percents from the greater value.

Here, data extrapolation for reducing truncation artifacts will be explained briefly (step 34 in FIG. 1). For further detail, refer to "Journal of Magnetic Resonance", Vol. 82, pp. 392–399 (1989) and "Proceedings of 16th Japanese Magnetic Resonance in Medicine", p. 284, (1990).

First, a method of effecting data extrapolation in the positive direction for the function f̂ on the one-dimensional bounded interval will be explained. To simplify the explanation, the explanation will be given on the method which effects linear prediction for the function f̂ defined on the discrete frequency K=0, ..., M−1 and expands the domain of definition to K=0, ..., N−1 (N>M).

The origin of the function f̂ is determined in the way described above, and a weight w having the origin as the reference is defined by the following equation (2a) or (2b):

$$w(K)=K-c \quad (2a)$$

or $$w(K)=\exp(2\pi i(K-c)/N) \quad (2b)$$

where
K: spatial frequency,
c: origin of signal,
i: imaginary number unit,
N: number of data.

The weight defined above is applied to the function f̂ and a function ĥ computed. An autoregressive assumption expressed by the following equation (3) is put to this function ĥ:

$$\hat{h}(n) = -\sum_{k=1}^{p} \hat{h}(n-k) \times (k) \quad (3)$$

where
p: number of prediction order,
x(i): prediction coefficients.

The prediction coefficients, which makes the square norm of the prediction error minimal, is determined from the given function ĥ and the prediction order p, and is substituted for the equation (3). The function ĥ is sequentially extended till k=N−1. This prediction coefficients x can be obtained in the following way. First of all, an equation Bx≃−b is established.

Here, B is a matrix of (M−p) row by p-column and the element Bij is given by $$B_{ij}=g(M-i-j+1), \quad (1\leq i\leq M-p, \ 1\leq j\leq p),$$

where x is a p-order vector to be determined, and b is an (M−p) order vector and the element bi is given by $$b_i=g(M-i+1), \quad (1\leq i\leq m-p),$$

where the symbol ≃ represents the least square norm. In other words, the vector x which makes $\|Bx+b\|$ minimal is determined.

As one method of solving this equation, a method using a normal equation and a singular value decomposition (hereinafter referred to as "SVD") will be explained.

First of all, the equation is modified into the normal equation in the following way. The Hermite conjugate of B is called B* and both sides of the equation are multiplied by this conjugate B*, providing the following equation:

$$Ax=-a$$

where A is the Hermite matrix of p-row by p-column given by A=B*B, and a is a=B*b.

When SVD is used for this matrix A, a certain unitary matrix V of p-row by p-column and a certain real-valued diagonal matrix Λ of p-row by p-column exist, and the relation A=VΛV* can be established. The prediction coefficient x can be calculated from this relation in accordance with the equation:

$$x=-V\Lambda^{-1}V^*a$$

Here, symbol $\Lambda^{-1}$ represents the value which makes $\lambda_i^{-1}$ correspond to each diagonal element of $\lambda_i$ (with the proviso that $\lambda_i^{-1}=0$ when $\lambda_i=0$), $\{\lambda_i\}$ are eigen values of the matrix A and V corresponds to eigen vector S of the matrix A.

A householder method, a bi-section method and an inverse iteration method are known to determine the eigen values and the eigen vectors. For details of these methods, refer to the following references:

"Mathematical Method for Digital Computers, 2", John Wiley, (1967).

"Solving Least Squares Problems", Prentice-Hall, (1974).

"The Symmetric Eigenvalue Problem", Prentice-Hall, (1980).

Here, the methods described above will be explained briefly. First, the Householder method is employed for the p-row p-column Hermite matrix A so as to convert it to a tri-diagonal matrix Δ having the same eigen values as the matrix A by multiplying a unitary matrix from back and front. In practice, a unitary matrix Q which makes the elements in the first column, after and including the third row zero, is multiplied from the front. When the Hermite conjugate Q* of this unitary matrix is multiplied from the back, the elements in the first row, after and including the third column become zero.

Next, a matrix exclusive of the first row and first column is considered, and the same procedure as described above is followed. As a result, the elements in the second column, after and including the fourth row and in the second row, after and including the fourth column can be made zero. At this time, the first row, first column must not be changed. When this procedure is iterated, the tri-diagonal matrix Δ can be obtained. Here, to obtain the q-row q-column unitary matrix Q for the q-order column vector v as described above, quantities σ, s, b and the q-order column vector u expressed by the following equation (4) are first obtained:

$$\sigma = \begin{cases} \dfrac{v_2}{|v_2|}, & (|v_2| \neq 0) \\ 1, & (|v_2| = 0) \end{cases} \tag{4}$$

$$s = -\sigma \sum_{i=2}^{q} v_i^2$$

$$u_i = \begin{cases} 0, & (i = 1) \\ v_2 - s, & (i = 2) \\ v_i, & (3 \leq 1 \leq q) \end{cases}$$

$$b = su_2$$

Next, the q-row q-column unitary matrix Q is determined using the quantity calculated by the equation (4) in accordance with the following equation (5):

$$Q = \begin{cases} I + \dfrac{uu^H}{b}, & (b \neq 0), \\ I, & (b = 0). \end{cases} \tag{5}$$

where $u^H$ is an inverted conjugate vector of u and I is a unit matrix of the q-row q-column matrix.

Next, the eigen values are calculated for the tridiagonal matrix Δ by the bi-section method. In other words, when the fact that the matrix A is a positive value matrix is taken into consideration, the eigen values $\{\lambda_i\}$ satisfy the relation:

$$0\leq \lambda_i \leq R, \quad (1\leq i\leq p)$$

where R is given by the following equation (6):

$$R = \max\left[\sum_{i=1}^{p} \Delta_{ij}; 1 \leq i \leq p\right] \tag{6}$$

This interval [0,R] is halved and the number of eigen values contained therein is determined. Furthermore, the same procedure is iterated for each interval to obtain the eigen values having desired accuracy. As to the tridiagonal matrix, there is a simple method of obtaining the number of desired eigen values at this time. Namely, the calculation of the following formula (7) is made by setting the center of the interval to a:

$$d_i = \begin{cases} \Delta_{11} - a, & (i = 1) \\ \left(\Delta_{ii} - \dfrac{|\Delta_{i,i+1}|^2}{d_{i-1}}\right) & (2 \leq i \leq p) \end{cases} \quad (7)$$

Here, the number of $d_i$ which is less than 0 is the number of eigen values contained in the lower half interval (interval of less than a).

Finally, the eigen vector is determined by the inverse iteration method.

The eigen vector v for the eigen value $\lambda_i$ can be obtained by effecting the following iteration calculation:

$$(A - \lambda_i)v_{k+1} = v_k$$

When the eigen vectors are normalized and are aligned in the matrix vector, the p-row p-column unitary matrix V can be obtained.

In this way, the function $\hat{h}$ can be expanded to $K = N - 1$. To expand the function $\hat{f}$ to $K = N - 1$, the function $\hat{h}$ is divided by the weight w, that is previously applied, on the expanded definition interval $K = M, \ldots, N-1$, and defining it as the function $\hat{f}$ on the $K = M, \ldots, N-1$.

When linear prediction is made in the negative direction, the interval of definition is changed to $K = 0, -1, -2, \ldots, -N+1$, in the linear prediction method in the positive direction.

When this method is used in practice, the function $\hat{g}$ and the function $\hat{h}$ become equal to each other when the offset distance r, which is used to decide whether or not linear prediction should be made, is set to be equal to the weight w used for linear prediction. In this way, the calculation quantity for obtaining the function $\hat{g}$ is not necessary, and the increase in the excessive calculation quantity for deciding whether or not linear prediction should be made can be eliminated.

A Cholesky method and a sweeping-out method can also be used in place of SVD.

Next, the application of the present invention to the two-dimensional image obtained by a practical nuclear magnetic resonance (NMR) apparatus will be explained.

First, data extrapolation in the readout direction will be explained. In other words, the method of adding data to the regions 32, 33 on the basis of the measured data row obtained for the region 31 shown in FIG. 3 will be explained.

The first inverse Fourier transform is made by regarding the measurement data F(Kx, Ky) as the function on the one-dimensional space in the encode direction for each Kx, and the resulting function is written as Fx(Kx, y). The data processing method according to the present invention explained above is applied by regarding the function Fx(Kx, y) as the function on the one-dimensional space in the readout direction for each y. In this instance, the definition zone is expanded for only those lines for which the evaluation value representing ringing of the function Fx(Kx, y) for each line in the read out direction exceeds a certain threshold value e. Finally, the second one-dimensional inverse Fourier transform is made by regarding the function Fx(Kx, y) as the function on the one dimensional domain in the readout direction for each y, and there is obtained a two-dimensional image.

Here, 0 is put into the line which is not expanded, during the second one-dimensional inverse Fourier transform, and one-dimensional inverse Fourier transform is then effected with, or without, expansion.

To carry out linear prediction by removing the background portion of the object, i.e. the portion having a low signal intensity, the sum of the signal intensities is calculated in the readout direction for each line after the first inverse Fourier transform, and the linear prediction may not be carried out depending on this sum.

To effect data extrapolation in the encode direction, the role in the readout direction and that in the encode direction in the linear prediction in the readout direction described above is exchanged. In this way, the data can be added to the regions 34 and 35 on the basis of the measurement data row obtained in the region 31 shown in FIG. 3.

According to this embodiment, the computation quantity relating to the data extrapolation can be reduced when the trancation artifacts are reduced using the data extrapolation.

The following method is employed when the data extrapolation is made in both readout and encode directions. First of all, the measurement data F(Kx, Ky) is subjected to inverse fourier transform in the encode direction to obtain the function Fx(Kx, y). The domain of definition of this function Fx(Kx, y) is expanded in the readout direction by the method explained above. Then, Fourier transform is effected in the encode direction to obtain the measurement data F(Kx, Ky) which is expanded in the readout direction. Subsequently, this is subjected to inverse Fourier transform to obtain the function Fy(x, Ky). The domain of definition of this function Fy(x, Ky) is expanded in the encode direction by the method explained above. Finally, inverse Fourier transform is effected in the encode direction to obtain a two-dimensional image. In this way, it is possible to obtain an image when data are added to the regions 32, 33, 34 and 35 on the basis of the measurement data row obtained in the region 31 shown in FIG. 3.

Here, the sequence of the data extrapolation may be replaced by exchanging the roles in the readout direction and the encode direction with one another.

Since the embodiment given above merely illustrates an example of the present invention, the invention should not naturally be limited thereto.

As described above in detail, the present invention provides a data processing method in an NMR apparatus which can reduce remarkably a computation quantity relating to data extrapolation when truncation artifacts are reduced by the use of data extrapolation.

We claim:

1. A data processing method for use in an inspection apparatus including magnetic field generation means for generating each of a static magnetic field, a gradient magnetic field and a radio frequency (RF) magnetic field, signal detection means for detecting nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:

a first step of computing an evaluation value representing the magnitude of ringing which occurs because a measured spatial frequency domain is limited in said spatial frequency space;

a second step of comparing whether or not the evaluation value obtained by said first step is greater than a predetermined threshold value; and a third step of extrapolating signals into spatial frequency domains which are located outside of said measured spatial frequency domain by the use of coefficients computed from the signals of said measured spatial frequency domain only when said evaluation value is greater than said predetermined threshold value at said second step.

2. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:

a first step of computing an evaluation value representing the magnitude of ringing, which occurs because a measured spatial frequency domain is limited in said spatial frequency space, from a product signal provided by the product of a frequency offset having an origin of a signal of said measured spatial frequency domain as a reference thereof and a signal of said measured spatial frequency domain;

a second step of comparing whether or not said evaluation value obtained at said first step is greater than a predetermined threshold value; and a third step of extrapolating signals into spatial frequency domains which are located outside of said measured spatial frequency, domain by the use of coefficients computed from the signals of said measured spatial frequency domain only when said evaluation value is greater than said predetermined threshold value at said second step in order to obtain an image ringing of which is corrected.

3. A data processing method in a nuclear magnetic resonance apparatus according to claim 2, wherein said frequency offset is determined in accordance with the formula $$r(K) = K - c$$

where K is a spatial frequency and c is said origin.

4. A data processing method in a nuclear magnetic resonance apparatus according to claim 2, wherein said frequency offset is determined in accordance with the formula $$r(K) = \exp(2\pi i(K-c)/N)$$

where $\pi$ is a ratio of the circumference, i is an imaginary number unit, K is a spatial frequency, c is said origin and N is a number of said data.

5. A data processing method for use in an inspection apparatus including magnetic field generation means for generating each of a static magnetic field, a gradient magnetic field and a radio frequency (RF) magnetic field, signal detection means for detection of nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:

a first step of computing an evaluation value representing the magnitude of ringing which occurs because a measured spatial frequency domain is limited in said spatial frequency space, from product signal provided by the product of a frequency offset having an origin of a signal of said measured spatial frequency domain as a reference thereof and a signal of said measured spatial frequency domain, computing a value obtained by integrating said product signals in a positive direction and a value obtained by integrating said product signals in a negative direction, and computing dividedly said integration value in the positive direction and said integration value in the negative direction;

a second step of comparing whether or not said evaluation values in the positive and negative directions are greater than predetermined threshold values in the positive and negative directions, respectively; and a third step of extrapolating signals into spatial frequency domains which are located outside of said measured spatial frequency domain in said positive and negative directions by the use of coefficients computed from the signals of said measured spatial frequency domain only when said evaluation values in said positive and negative directions are greater than said predetermined threshold values in said positive and negative directions, respectively, at said second step in order to obtain an image ringing of which is corrected.

6. A data processing method in a nuclear magnetic resonance apparatus according to claim 5, wherein said frequency offset is determined in accordance with the formula $$r(K) = K - c$$

where K is a spatial frequency and c is said origin.

7. A data processing method in a nuclear magnetic resonance apparatus according to claim 5, wherein said frequency offset is determined in accordance with the formula $$r(K) = \exp(2\pi i(K-c)/N)$$

where $\pi$ is a ratio of the circumference, i is an imaginary number unit, K is a spatial frequency, c is said origin and N is a number of said data.

8. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signal from an inspection object, a computer for computing detection signals from said signal detection means and output means for outputting the computation result of said computer, for obtaining an image by effecting inverse Fourier transform of a measurement signal row representing that of spatial frequency space, comprising:

a first step of computing an evaluation value representing the magnitude of ringing which occurs because a measured spatial frequency domain is limited in said spatial frequency space, from a product signal provided by the product of a frequency offset having an origin of a signal of said measured spatial frequency domain as a reference thereof and a signal of said measured spatial frequency domain, by computing a point at which the absolute value of the signal of said measured spatial frequency domain becomes maximal, and using said point as the origin of the signal of said measured spatial frequency domain;

a second step of comparing whether or not said evaluation value obtained at said first step is greater than a predetermined threshold value; and a third step of extrapolating signals into spatial frequency domains which are located outside of said measured spatial frequency domain by the use of coefficients computed from the signals of said measured spatial frequency domain only when said evaluation value is greater than said predetermined threshold value in order to obtain an image ringing of which is corrected.

9. A data processing method in a nuclear magnetic resonance apparatus according to claim 8, wherein said frequency offset is determined in accordance with the formula $$r(K)=K-c$$

where K is a spatial frequency and c is said origin.

10. A data processing method in a nuclear magnetic resonance apparatus according to claim 8, wherein said frequency offset is determined in accordance with the formula $$r(K)=\exp(2\pi i(K-c)/N)$$

where $\pi$ is a ratio of the circumference, i is an imaginary number unit, K is a spatial frequency, c is said origin and N is a number of said data.

11. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:

a first step of computing an evaluation value representing the magnitude of ringing which occurs because a measured spatial frequency domain is limited in said spatial frequency space, from product signals provided by the product of a frequency offset having an origin of a signal of said measured spatial frequency domain as a reference thereof and a signal of said measured spatial frequency domain, by computing a point at which the absolute value of the signal of said measured spatial frequency domain becomes maximal, and using said point as the origin of the signal of said measured spatial frequency domain, computing then a value obtained by integrating said product signals in a positive direction from said origin and a value obtained by integrating said product signals in a negative direction from said origin, and computing dividedly said integration values in said positive and negative directions as evaluation values in said positive and negative directions, respectively;

a second step of comparing whether or not said evaluation values in said positive and negative directions obtained at said first step are greater than predetermined threshold values in said positive and negative directions, respectively; and a third step of extrapolating signals into spatial frequency domains which are located outside of said measured spatial frequency domain by the use of coefficients computed from the signals of said measured spatial frequency domain only when said evaluation values in said positive and negative directions are greater than said predetermined threshold values in said positive and negative directions, respectively, at said second step in order to obtain an image ringing of which is corrected.

12. A data processing method in a nuclear magnetic resonance apparatus according to claim 11, wherein said frequency offset is determined in accordance with the formula $$r(K)=K-c$$

where K is a spatial frequency and c is said origin.

13. A data processing method in a nuclear magnetic resonance apparatus according to claim 11, wherein said frequency offset is determined in accordance with the formula $$r(K)=\exp(2\pi i(K-c)/N)$$

where $\pi$ is a ratio of the circumference, i is an imaginary number unit, K is a spatial frequency, c is said origin and N is a number of said data.

14. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency domain, comprising:

a first step of computing an evaluation value representing the magnitude of ringing which occurs because a measured spatial frequency domain is limited in said spatial frequency space, from a product signal provided by the product of a frequency offset having an origin of a signal of said measured spatial frequency domain as a reference thereof and a signal of said measured spatial frequency domain;

a second step of comparing whether or not said evaluation value obtained at said first step is greater than a predetermined threshold value; and a third step of extrapolating signals into spatial frequency domains which are located outside of said measured spatial frequency domain by the use of coefficients for data extrapolation computed from said product signal obtained at said first step, only when said evaluation value is greater than said predetermined threshold value at said second step in order to obtain an image ringing of which is corrected.

15. A data processing method in a nuclear magnetic resonance apparatus according to claim 14, wherein said frequency offset is determined in accordance with the formula $$r(K)=K-c$$

where K is a spatial frequency and c is said origin.

16. A data processing method in a nuclear magnetic resonance apparatus according to claim 14, wherein said frequency offset is determined in accordance with the formula $$r(K)=\exp(2\pi i(K-c)/N)$$

where $\pi$ is a ratio of the circumference, i is an imaginary number unit, K is a spatial frequency, c is said origin and N is a number of said data.

17. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:
- a first step of computing an evaluation value representing the magnitude of ringing which occurs because a measured spatial frequency domain is limited in said spatial frequency space, from product signals provided by the product of a frequency offset having an origin of a signal of said measured spatial frequency domain as a reference thereof and a signal of said measured spatial frequency domain, computing value obtained by integrating said product signals in a positive direction and a value obtained by integrating said product signals in a negative direction, and computing dividedly said integration value in the positive direction and said integration value in the negative direction;
- a second step of comparing whether or not said evaluation values in the positive and negative directions are greater than predetermined threshold values in the positive and negative directions, respectively; and
- a third step of computing coefficients for data extrapolation from said product signals obtained at said first step in said positive and negative directions, respectively, and extrapolating signals into spatial frequency domains which are located outside of said measured spatial frequency domain by the use of said coefficients, only when said evaluation values in said positive and negative directions are greater than said threshold values in said positive and negative directions, respectively, at said second step in order to obtain an image ringing of which is corrected.

18. A data processing method in a nuclear magnetic resonance apparatus according to claim 17, wherein said frequency offset is determined in accordance with the formula $$r(K)=K-c$$

where K is a spatial frequency and c is said origin.

19. A data processing method in a nuclear magnetic resonance apparatus according to claim 17, wherein said frequency offset is determined in accordance with the formula $$r(K)=\exp(2\pi i(K-c)/N)$$

where $\pi$ is a ratio of the circumference, i is an imaginary number unit, K is a spatial frequency, c is said origin and N is a number of said data.

20. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:
- a first step of computing an evaluation value representing the magnitude of ringing, which occurs because a measured spatial frequency domain is limited in said spatial frequency space, from a product signal provided by the product of a frequency offset having an origin of a signal of said measured spatial frequency domain as a reference thereof and a signal of said measured spatial frequency domain, by computing a point at which the absolute value of the signal of said measured spatial frequency domain becomes maximal, and using said point as the origin of the signal of said measured spatial frequency domain;
- a second step of comparing whether or not said evaluation value obtained at said first step is greater than a predetermined threshold value; and
- a third step of computing coefficients for data extrapolation from said product signal obtained at said first step, and extrapolating signals into spatial frequency domains which are located outside of said measured spatial frequency domain by the use of said coefficients only when said evaluation value is greater than said predetermined threshold value at said second step in order to obtain an image ringing of which is corrected.

21. A data processing method in a nuclear magnetic resonance apparatus according to claim 20, wherein said frequency offset is determined in accordance with the formula $$r(K)=K-c$$

where K is a spatial frequency and c is said origin.

22. A data processing method in a nuclear magnetic resonance apparatus according to claim 20, wherein said frequency offset is determined in accordance with the formula $$r(K)=\exp(2\pi i(K-c)/N)$$

where $\pi$ is a ratio of the circumference, i is an imaginary number unit, K is a spatial frequency, c is said origin and N is a number of said data.

23. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signal from an inspection object, a computer for computing detection signals from said signal detection means and output means for outputting the computation result of said computer, for obtaining an image by effecting inverse Fourier transform of a measurement signal row representing data of spatial frequency space, comprising:

a first step of computing an evaluation value representing the magnitude of ringing which occurs because a measured spatial frequency domain is limited in said spatial frequency space, from product signals provided by the product of a frequency offset having an origin of a signal of said measured spatial frequency as a reference thereof and a signal of said measured spatial frequency domain becomes maximal, and using said point as the origin of the signal of said measured spatial frequency domain, by computing a point at which the absolute value of the signal of said measured spatial frequency domain becomes maximal, and using said point as the origin of the signal of said measured spatial frequency domain, computing then a value obtained by integrating said product signals in a negative direction from said origin, and computing dividedly said integration values in said positive and negative directions as evaluation values in said positive and negative directions as evaluation values in said positive and negative directions, respectively;

a second step of comparing whether or not said evaluation values in said positive and negative directions obtained at said first step are greater than predetermined threshold values in said positive and negative directions, respectively; and a third step of computing coefficients for data extrapolation from said product signals obtained at said first step in said positive and negative directions, respectively, and extrapolating signals into spatial frequency domains which are located outside of said measured spatial frequency domain, only when said evaluation values in said positive and negative directions are greater than said threshold values in said positive and negative directions, respectively, at said second step in order to obtain an image ringing of which is corrected.

24. A data processing method in a nuclear magnetic resonance apparatus according to claim 23, wherein said frequency offset is determined in accordance with the formula $$r(K) = K - c$$

where K is a spatial frequency and c is said origin.

25. A data processing method in a nuclear magnetic resonance apparatus according to claim 23, wherein said frequency offset is determined in accordance with the formula $$r(K) = \exp(2\pi i(K-c)/N)$$

where $\pi$ is a ratio of the circumference, i is an imaginary number unit, K is a spatial frequency, c is said origin and N is a number of said data.

26. A data processing method for use in an inspection apparatus including magnetic field generation means for generating each of a static magnetic field, a gradient magnetic field and a radio frequency (RF) magnetic field, signal detection means for detecting a nuclear magnetic resonance (NMR) signals from an inspection object, a computer for computing detection signals from said signal detection means and output means for outputting the computation result of said computer, for obtaining an image by effecting inverse Fourier transform of a measurement signal row representing data of spatial frequency space, comprising:

a first step of effecting a first inverse Fourier transform in a first direction for data arrays arranged in a matrix in a measured spatial frequency domain, respectively;

a second step of computing an evaluation value representing the magnitude of ringing in a second direction orthogonal to said first direction for said data arrays subjected to inverse Fourier transform at said first step for each line;

a third step of comparing whether or not data extrapolation should be made in said second direction for each line, on the basis of said evaluation value obtained at said second step; and a fourth step of extrapolating data into spatial frequency domains which are located outside of said measured spatial frequency domain by the use of coefficients computed from said data arrays when the result of comparison at said third step represents that extrapolation should be made, and effecting a second inverse Fourier transform in said second direction in order to obtain an image ringing of which is corrected.

* * * * *